Jan. 10, 1956 F. A. WOOD 2,730,682

TUNING NETWORK STRUCTURE

Filed May 1, 1952

INVENTOR:
FRANK WOOD
BY Francis W. Crotty
HIS ATTORNEY.

2,730,682
Patented Jan. 10, 1956

2,730,682

TUNING NETWORK STRUCTURE

Frank A. Wood, Elmhurst, Ill., assignor to Zenith Radio Corporation, a corporation of Illinois Application May 1, 1952, Serial No. 285,379
4 Claims. (Cl. 336—142)

This invention relates to a new and improved tuning network structure which is particularly valuable and advantageous when employed in a step-by-step turret tuner.

Modern television and other signal receivers include turret tuners for selectively tuning the receiver to signals in a predetermined frequency band by switching pretuned circuits or elements thereof into the radio-frequency amplifier and heterodyning oscillator stages. Turret tuners of this general type are well known in the art; one which is particularly suited to television receivers is described and claimed in the copending application of John F. Bell and Albert Cotsworth III, Serial No. 58,696, filed November 6, 1948, now U. S. Patent No. 2,596,117, issued May 13, 1952, and assigned to the same assignee as the present invention.

In general, a turret tuner comprises a set of stationary contacts, an associated rotor having mounting provisions for accommodating a plurality of "tuning strips," and amplifier and oscillator circuits. Each of the tuning strips carries at least one inductive or capacitive reactance element, or combinations thereof, to be functionally and selectively associated with the tunable stages of the receiver by rotation of the turret rotor, which brings strips successively into engagement with the stationary contacts of the tuner and thus permits step-by-step selection of the desired broadcast frequencies.

Although the tuning strips themselves are physically quite small and not unduly complicated structurally, they comprise a highly important factor in the cost of the completed receiver, and, furthermore, play a major role in determining its performance. Their importance as an economic factor may be readily seen from the fact that most turrets include 24 individual tuning strips, no one of which is identical to any of the others; obviously, any increment in the cost of producing the individual strips is multiplied 24-fold in the price of the completed receiver. Consequently, any reduction in the cost of these components is extremely desirable.

All of the tuning strips for step-by-step turret tuners known to applicant and manufactured for commercial utilization have included inductance coils which are wound on coil forms constituting thin-walled tubes manufactured from fiber or plastic materials. When the wire or other metallic conductor of the inductance coil is wound on such a coil form, it almost inevitably is pressed into the material of the form, and consequently it is difficult to predict the exact final internal diameter of the coil. In addition, the spacing between separate coils wound on the same form is not easily adjustable after the winding operation, since the coils become firmly seated in the form material and cannot be adjusted with relation thereto. Because the inductance of the coil is directly related to its physical proportions, including interturn spacing, number of turns, and diameter, any varation in the effective dimensions of the coil form produces a corresponding variation in the effective inductance. Thus, the dimensional variations introduced by deformation of the forms, which are not subject to precise control, cause unpredictable divergencies from the desired coil inductance.

In order to permit utilization of standardized strip bases, prior art strips of the type under consideration are usually standardized about a single coil form or a relatively small number of coil forms. Although this standardization allows efficiency in manufacturing, it has the inevitable disadvantage of restricting the freedom of the coil designer in attempting to achieve the desired electrical characteristic in the coils. Also, winding different sized coil conductors on the forms and varying the number of turns in the coils produces uncontrolled variations in the inside diameter of the resulting composite structure. This presents difficult problems in providing adjustable cores for the coils, since a core which fits easily within one coil structure may bind when an attempt is made to insert it in another.

It is an object of this invention, therefore, to provide an improved tuning strip incorporating self-supporting inductance coils which do not require coil forms or any other internal supporting means.

It is a further object of this invention to present an improved tuning strip which is economical to manufacture and simple and expedient to assemble.

It is a corollary object of this invention to provide simple and efficient means for mounting, on a tuning strip, an adjustable tuning core for an inductance coil.

It is an additional object of this invention to provide an improved tuning strip for a step-by-step tuner incorporating inductance coils, the electrical constants of which may be rigidly and precisely controlled, and also to provide means to attain an exact degree of mutual inductive coupling between such coils.

A tuning strip in accordance with the invention is especially suited for a step-by-step turret tuner having mounting provisions for accommodating a plurality of such strips. The strip comprises a base member to be received and supported by the mounting provisions of the turret and includes a substantially V-shaped elongated channel portion. At least one self-supporting inductance coil is mounted in nested parallel relation within the channel and has lead-in portions which project transversely beyond the channel. A plurality of contact terminals are electrically connected to the coil lead-in portions and are supported by the base member in mutually insulating relation.

The features of the present invention which are believed to be novel are set forth with particularity in the appended claims. The organization and manner of operation of the invention, together with further objects and advantages thereof, may best be understood by reference to the following description, taken in connection with the accompanying drawings, in the several figures of which like reference numerals indicate like elements and in which:

Figure 1:
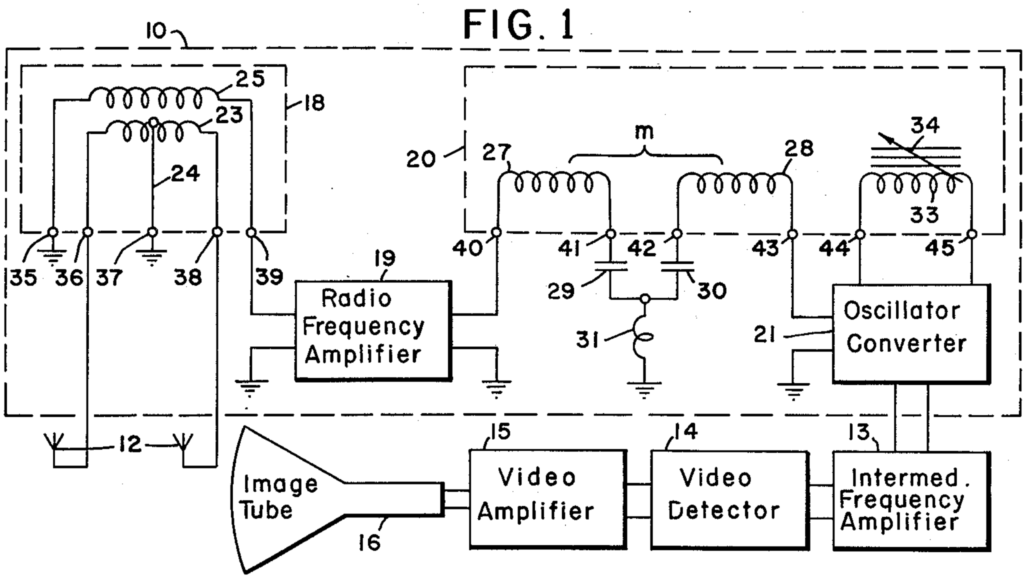
Figure 1 is a schematic diagram of a television receiver including a turret tuner in which the invention is included.

The receiver represented schematically in Figure 1 includes a step-by-step turrent tuner 10, an antenna 12, an intermediate-frequency amplifier 13, a video detector 14, a video amplifier 15, and an image tube 16. Tuner 10 is interposed between antenna 12 and intermediate-frequency amplifier 13 and comprises for each tuning position an antenna strip 18 and an oscillator tuning strip 20. These strips are selectively movable, as described hereinafter, and when inserted in the receiver they complete a signal circuit from antenna 12 to a radio-frequency amplifier 19, to an oscillator-converter 21, and thence to intermediate-frequency amplifier 13. Amplifier 19 and converter 21 are stationary and may be supported from the stator of the tuner. Antenna strip 18 includes an antenna coil 23 having a grounded center-tap 24 and an input coil 25 connected in the input circuit of radio-frequency amplifier 19. Oscillator strip 20 comprises a load coil 27 connected in the output circuit of radio-frequency amplifier 19 and inductively coupled to a converter input coil 28, the mutual inductance of coils 27 and 28 being indicated by a bracket M. A radio-frequency filter circuit, comprising capacitors 29 and 30 and an inductor 31, is also electrically connected between the adjacent terminals of coils 27 and 28. Converter input coil 28 is in circuit with one set of input terminals of oscillator-converter 21; a second set of input terminals for the oscillator-converter is connected to an oscillator frequency-determining coil 33 which is also included on strip 20. A variable tuning core 34 for adjusting the inductance of oscillator coil 33 is likewise mounted on the strip.

The circuit connections between the elements of strips 18 and 20 and the remainder of the tuner components are provided by a plurality of contacts numbered 35 through 45, each contact comprising a pair of terminals. One terminal of each pair forms a part of the strip itself while the other, or companion, terminal of each pair is included in the usual set of stationary contacts. Tuner 10 includes a plurality of antenna strips and a corresponding plurality of oscillator strips similar to those illustrated in Figure 1 and bearing suitable tuning reactances to be switched into functional relation with the tunable stages of the receiver. The strips are normally mounted in pairs on a turret rotor which may be rotated to bring any desired pair into engagement with the single set of stationary terminals of the contacts 35—45. Since this general type of turret structure is well known in the art, further structural details of the rotor and stator other than the representative pair of tuning strips 18 and 20 have not been illustrated in the drawings.

The operation of a tunable television receiver featuring a turret tuner is thoroughly understood in the art, and a detailed description thereof is deemed unnecessary. Briefly, a carrier wave signal, modulated with sound and picture information, is intercepted by antenna 12 and applied to radio-frequency amplifier 19 through the radio-frequency selector comprising coils 23 and 25. The received signal is then transferred through an input selector 27, 28 to converter 21, wherein it is heterodyned with a local heterodyning signal produced by the oscillator portion of circuit 21, including frequency-determining coil 33 and its variable tuning core 34. This heterodyning action produces an intermediate-frequency signal which is delivered to amplifier 13, demodulated at video detector 14, amplified by circuit 15, and utilized in image tube 16 to reproduce a picture corresponding to the original transmitted information. The filter circuit comprising capacitors 29 and 30 and inductor 31 operates as a "suck-out" circuit to prevent feedback from the intermediate-frequency section of the receiver to the antenna section. The electrical parameters of the circuit elements supported on strips 18 and 20 are selected to tune the receiver to a predetermined carrier-wave frequency; the aforementioned turret structure is utilized to selectively replace these strips with other similar pairs of strips carrying coils of varying inductance to tune the receiver to other carrier frequencies. It will be recognized that several of the circuit structures normally present in a receiver of this type have been omitted for the purpose of clarity and brevity in presentation.

Figure 2:
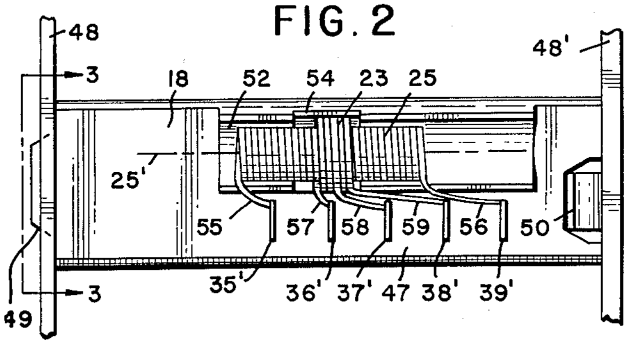
Figure 2 is a top plan view of a tuning strip embodying the invention.
Figure 3:
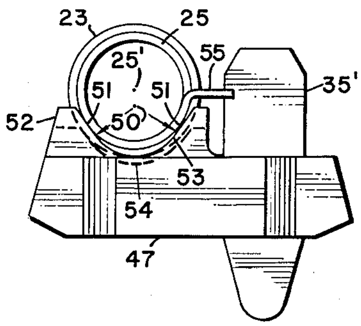
Figure 3 is a view of the tuning strip of Figure 2 taken along line 3—3 of that figure.

The physical structure of antenna strip 18, as illusstrated in Figures 2 and 3, includes a base member 47 having a tongue-like projection 49 at one end to be received in a slot in one endplate 48 of the turret rotor and having a recess at the opposite end into which a lock spring 50, affixed to the alternate end plate 48′ of the rotor, extends to removably secure the strip to the frame of the rotor. A substantially V-shaped elongated channel member 52 is provided on base 47, preferably being formed integrally therewith. For example, they may be fabricated from a molded plastic insulating material, although the composite structure may likewise be manufactured from a metallic or other conductive material. If the base is conductive, it must be coated with insulation or other precautions must be observed to avoid undesirably short circuiting the tuning reactors and other circuit components supported thereon. Coil 25 of the radio-frequency input selector is mounted within channel 52 with its central axis 25′ paralleling the channel, and antenna coil 23, which is formed concentrically with and externally of coil 25, is similarly nested in an enlarged or relieved central portion of channel 52. Contact terminals 35′ through 39′ are supported by base member 47 in mutually insulating relation with respect to one another. The lead-in portions 55 and 56 of coil 25 are electrically connected to contact terminals 35′ and 39′ respectively, while the lead-in sections and ground connections 57, 58 and 59 of coil 23 are in electrical circuit with contact terminals 36′, 37′ and 38′. Transverse slots may be provided in the side walls of channel 52 for receiving coil lead-in portions 55 through 59. The end view of Figure 3 gives a more complete picture of the configuration and dimensions of channel 52 and its relation to coils 23 and 25. As shown therein, the bottom portion 53 of channel 52 describes a short circular arc having a center 50, while the channel walls 51 comprise planes tangent to that circle. It is desirable that the arc be restricted to substantially less than 180 degrees in order that channel walls 51 will be divergent with respect to base 53. Enlarged section 54 has the same general configuration as channel 52, but is made somewhat wider and deeper to correspond to the larger diameter of overlapping coil 23. It is preferable that both coils 23 and 25 have an external diameter slightly larger than that of the arc described by the base portions of enlarged section 53 and channel 52 respectively so that the coils contact the channel walls in at least two points and may be cemented or bonded to the walls at those points. If the arc formed by base 53 approaches 180 degrees, and the diameter of coil 25 is larger than that of the arc, the coil does not seat properly in the channel, but tends to sit up on top of channel walls 51. This reduces the rigidity of the structure and makes it extremely difficult to center the coil with respect to the channel.

Coils 23 and 25 are not supported by a central coil form; rather, they are constructed as relatively rigid self-supporting elements. There are several possible practical means of manufacturing coils which do not require a central supporting structure; one efficient and economical method of producing these circuit elements is to wind them from Celanese served, nylon coated copper wire on the mandrels of a torsion-type coiler. After winding, preferred practice dictates that they be bonded together by means of an acetone dip. This procedure results in a rigid coil which may be handled without distortion or damage and may include as many as 50 turns per inch. The use of an automatic torsion coiler permits restricting the length of the coils to very rigid dimensions and also makes it possible to hold the coil inductance to within plus or minus 1% of the desired value without taking undue precautions in the manufacturing process.

The above-described accuracy of manufacture is not normally possible with form-wound coils, since there are no known methods available for maintaining exact dimensional tolerances with a plastic or paper form without incurring prohibitive manufacturing expenses. Furthermore, by winding to the exact diameters permitted where mandrels are employed, the mutual coupling inductance between coils 23 and 25 can be maintained with precision, which is not true of the prior-art methods. V-shaped channel 52 maintains the coils in alignment on the strip and provides an effective mounting base for them, while the divergent shape of the channel walls permits utilization of the same channel and base structure with coils of varying diameters. The described strip structure completely eliminates any requirement for coil forms and consequently effects a material reduction in handling and assembly expense. The usual secondary bending operation is omitted, since it may be done on the winding machine, and the types of coils are reduced to the lowest number possible, thus effecting considerable economy in standardization of tooling and materials.

Figure 4:
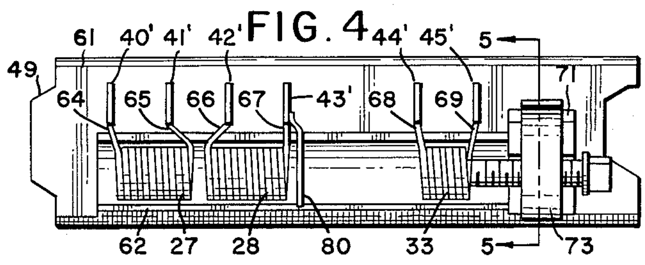
Figure 4 is a top plan view of another tuning strip including the invention.
Figure 5:
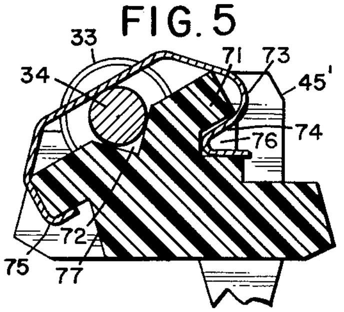
Figure 5 is a sectional view of the tuning strip of Figure 4 taken along line 5—5 of that figure.

Oscillator strip 20, illustrated in Figures 4 and 5, is structurally quite similar to antenna strip 18. It includes a base member 61 supporting a channel portion 62 in which are nested coils 27, 28 and 33. Coil lead-in portions 64 through 69 extend transversely of channel 62 and are individually electrically connected to contact terminals 40' through 45'. The cross sectional configuration and dimensions of channel 62 and coils 27, 28 and 33 are inter-related in precisely the same manner as described in conjunction with antenna strip 18, except that all of the coils are of similar diameter and do not overlap each other.

As seen in Figure 4, an adjustable tuning core structure is provided for oscillator coil 33. This structure comprises a guide portion 71, projecting from base member 61, into which is formed a substantially V-shaped slot 72. The position and configuration of slot 72 are more clearly illustrated in the sectional view of Figure 5. A tuning core 34 is supported in slot 72 in essentially coaxial alignment with coil 33 and is held in the slot by a retaining member 73. Retaining member 73 comprises a spring clamp which is mounted on guide portion 71 through the engagement of its end sections 74 and 75 with surfaces 76 and 77 formed in the guide. Although tuning core 34 may be of any desired shape and surface configuration, it is preferred that it take the form of a threaded shaft, as illustrated. When this structure is employed, the threads of core 34 partially imbed themselves into the surface of slot 72, due to the biasing action of retaining member 73.

An inductive tuning element 80, shown in Figure 4, is connected to terminal 43; tuning element 80 comprises a strip of metal, with or without a central opening, supported in channel 62 in adjustable spaced relationship to one end of a selected coil, in this instance coil 28. The spacing between coil 28 and tuning element 80 is adjusted by bending the tuning element, thus varying the effective inductance of the coil.

As noted in connection with strip 18, channel structure 62 provides means for retaining self-supporting coils 27, 28 and 33 in precise spaced relationship to each other and to base member 61, the coils being cemented to the channel. The rotation of core 34, in cooperation with its partially threaded mounting in slot 72 and the retention therein provided by retaining member 73 permits exact adjustment of the effective inductance of oscillator coil 33. Inductive tuning element 80, on the other hand, provides a simple and inexpensive means of obtaining the desired inductive effect in coil 28; this same expedient is, of course, applicable to coil 27. This latter provision permits a considerable reduction in the strip-balancing adjustments normally required with form-wound coils.

The invention provides a simple and economical tuning strip structure permitting maintenance of far greater accuracy with respect to performance than any type known to the prior art. The component parts are susceptible to expeditious and rapid assembly and are not easily distorted or broken in the course of normal handling. The resultant strip structure is flexible in meeting varying operating conditions and permits the maximum possible standardization of components and the tools employed in their manufacture.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A tuning strip for a step-by-step turret tuner having mounting provisions for accommodating a plurality of such strips, said tuning strip comprising: a base member of insulating material to be received and supported by said mounting provisions and including on one face thereof an elongated projecting section which defines a substantially V-shaped elongated channel section; at least one self-supporting inductance coil mounted in nested parallel relation within said channel and having lead-in portions projecting transversely beyond said channel section and across the upper edge thereof; and a plurality of feed-through contact terminals electrically connected to said lead-in portions of said coil, projecting through and supported by said base member at one side of said channel section.

2. A tuning strip for a step-by-step turret tuner having mounting provisions for accommodating a plurality of such strips, said tuning strip comprising: a base member of insulating material to be received and supported by said mounting provisions and including on one face thereof an elongated projecting section which defines a substantially V-shaped elongated channel section comprising an arcuate base subtending an angle substantially less than 180 degrees and a pair of side walls forming planes tangential to said arcuate portion; at least one self-supporting inductance coil mounted in nested parallel relation within said channel, said coil having an outside diameter such that it is engaged by both of said side walls of said channel and further having lead-in portions projecting transversely beyond said channel section and across the upper edge thereof; and a plurality of feed-through contact terminals electrically connected to said lead-in portions of said coil, projecting through and supported by said base member at one side of said channel section.

3. A tuning strip for a step-by-step turret tuner having mounting provisions for accommodating a plurality of such strips, said tuning strip comprising: a base member to be received and supported by said mounting provisions and including a substantially V-shaped elongated channel portion; at least one self-supporting inductance coil mounted in nested parallel relation within said channel and having lead-in portions projecting transversely beyond said channel; a plurality of contact terminals electrically connected to said lead-in portions of said coil and supported by said base member in mutually insulating relation; a guide projecting from said base member at one end of said channel portion and including a substantially V-shaped slot in axial alignment with said coil; a threaded tuning core supported in said slot in essentially coaxial alignment with a selected one of said coils and at least partially threaded into said guide portion; and a retaining member retaining said tuning core in said guide for movement into and out of said coil.

4. A tuning strip for a step-by-step turret tuner having mounting provisions for accommodating a plurality of such strips, said tuning strip comprising: a base member to be received and supported by said mounting provisions and including a substantially V-shaped elongated channel portion of predetermined dimensions; a plurality of self-supporting inductance coils of preselected external diameter, cemented in nested parallel relation within said channel in contact with both sides thereof and individually having lead-in portions projecting tranversely beyond said channel; a plurality of contact terminals electrically connected to said lead-in portions of said coils and supported by said base member in mutually insulating relation; a guide portion projecting from said base member at one end of said channel portion and including a substantially V-shaped slot paralleling said channel; a threaded tuning core supported in said slot in essentially coaxial alignment with a selected one of said coils and at least partially threaded into said guide portion; and a retaining member mounted on said guide portion in engagement with said tuning core.

References Cited in the file of this patent

UNITED STATES PATENTS

| | | |
|---|---|---|
| 1,577,794 | Elliott | Mar. 23, 1926 |
| 2,103,035 | Lear | Dec. 21, 1937 |
| 2,430,990 | Moore | Nov. 18, 1947 |
| 2,496,183 | Thias et al. | Jan. 31, 1950 |
| 2,611,088 | Harvey | Sept. 16, 1952 |
| 2,614,248 | Ostreicher | Oct. 14, 1952 |

FOREIGN PATENTS

| | | |
|---|---|---|
| 359,168 | Great Britain | Oct. 22, 1931 |